(12) United States Patent
Sugitani et al.

(10) Patent No.: US 8,156,399 B2
(45) Date of Patent: Apr. 10, 2012

(54) LOW DENSITY PARITY CHECK CODES DECODER AND METHOD THEREOF

(75) Inventors: Atsuhiko Sugitani, Kanagawa (JP); Toshiyuki Takada, Kanagawa (JP)

(73) Assignee: Mobile Techno Corp., Kawasaki-shi (JP)

( * ) Notice: Subject to any disclaimer, the term of this patent is extended or adjusted under 35 U.S.C. 154(b) by 0 days.

(21) Appl. No.: 13/041,957

(22) Filed: Mar. 7, 2011

(65) Prior Publication Data

US 2011/0161788 A1     Jun. 30, 2011

Related U.S. Application Data

(62) Division of application No. 11/890,511, filed on Aug. 7, 2007, now Pat. No. 8,028,214.

(30) Foreign Application Priority Data

Aug. 17, 2006 (JP) ................................. 2006-222531
Aug. 21, 2006 (JP) ................................. 2006-224431

(51) Int. Cl.
*H03M 13/00* (2006.01)

(52) U.S. Cl. ......................................... 714/752; 714/801

(58) Field of Classification Search .................. 714/752, 714/755, 801
See application file for complete search history.

(56) References Cited

U.S. PATENT DOCUMENTS

| 7,072,417 | B1 | 7/2006 | Burd et al. | |
| 7,162,684 | B2 | 1/2007 | Hocevar | |
| 7,178,080 | B2 | 2/2007 | Hocevar | |
| 7,434,138 | B2 | 10/2008 | Lin et al. | |
| 7,590,914 | B2 * | 9/2009 | Kim et al. | 714/752 |
| 7,689,888 | B2 * | 3/2010 | Kan et al. | 714/758 |
| 7,725,810 | B2 * | 5/2010 | Paumier et al. | 714/800 |
| 7,730,377 | B2 | 6/2010 | Hocevar | |
| 7,751,505 | B1 | 7/2010 | Wu et al. | |
| 7,783,958 | B1 * | 8/2010 | Eidson et al. | 714/780 |

(Continued)

FOREIGN PATENT DOCUMENTS

JP      2005-045735 A      2/2005

OTHER PUBLICATIONS

R.G. Gallager, "Low-Density Parity-Check Codes", IRE Transactions on Information Theory, (1962), pp. 21-28.
A. J. Blanksby et al., "A 690-mW 1-Gb/s 1024-b, Rate-1/2 Low-Density Parity-Check Code Decoder", IEEE Journal of Solid-State Circuits, (2002), pp. 404-412, vol. 37, No. 3.

(Continued)

*Primary Examiner* — Esaw Abraham
(74) *Attorney, Agent, or Firm* — Foley & Lardner LLP

(57) ABSTRACT

A low density parity check codes decoder decodes an LDPC code with an arbitrary coding rate by the same configuration. The low density parity check codes decoder enables decoding of an LDPC code constituted by a base matrix of Mbmax rows and Nbmax columns and a permutation matrix as an element of the base matrix. It stores therein Mbmax×Nbmax validity/invalidity flags, shift amounts of valid permutation matrices, a permutation matrix size in a processing target code, and the number of rows of a base matrix in the processing target code, determined depending on a check matrix for the processing target LDPC code, and generates column addresses and a row address to be given to column processing calculation sections and a row processing calculation section that perform calculation in accordance with a BP algorithm by utilizing the stored information, so that it can process an LDPC code for a smaller base matrix than the aforementioned base matrix as well.

10 Claims, 10 Drawing Sheets

U.S. PATENT DOCUMENTS 7,802,163 B2   9/2010  Tan
7,843,959 B2 * 11/2010 Kampmann et al. .......... 370/465

OTHER PUBLICATIONS

Y. Chen et al., "A FPGA and ASIC Implementation of Rate ½, 8088-b Irregular Low Density parity check Decoder", IEEE Globecom (2003), pp. 113-117.

M. M. Mansour et al., "High-Throughput LDPC Decoders", IEEE Transactions on Very large Scale Integration Systems, (2003), pp. 976-996, vol. 11, No. 6.

A. Sugitani, U.S. PTO Office Action, U.S. Appl. No. 11/890,511, dated Mar. 10, 2011, 11 pages.

A. Sugitani, U.S. PTO Notice of Allowance, U.S. Appl. No. 11/890,511, dated Jun. 1, 2011, 7 pages.

* cited by examiner

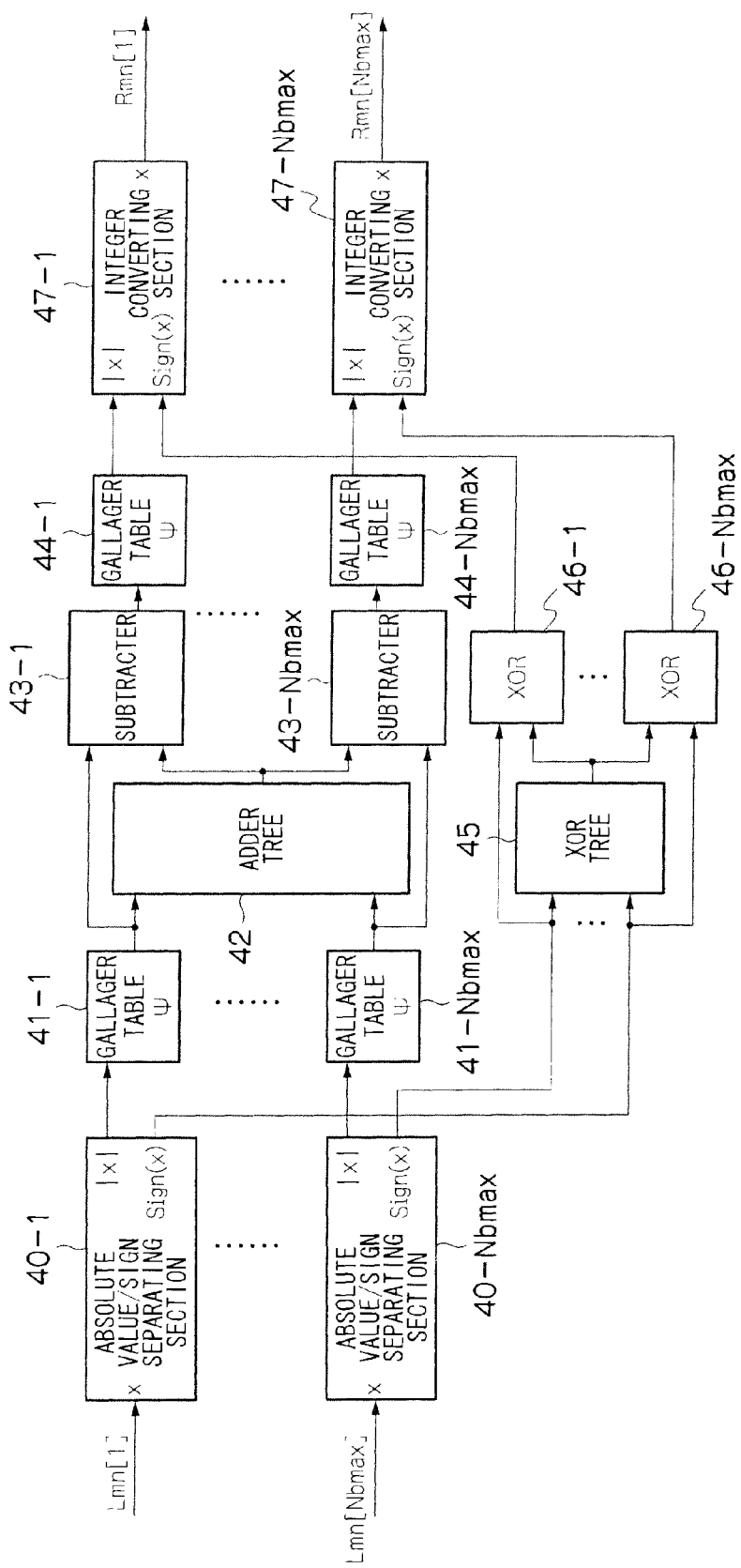

FIG.5A

| ADDRESS | T1(11-1) | | T2 | | T3 | | T4 | | T5 | | T6 | | T7 | | T8 | |
|---|---|---|---|---|---|---|---|---|---|---|---|---|---|---|---|---|
| 0 | 1 | 2 | 1 | 0 | 1 | 2 | 0 | – | 1 | 4 | 0 | – | 0 | – | 0 | – |
| 1 | 0 | – | 1 | 3 | 1 | 1 | 0 | – | 1 | 3 | 0 | – | 0 | – | 0 | – |
| 2 | 1 | 3 | 1 | 5 | 0 | – | 1 | 4 | 0 | – | 0 | – | 0 | – | 0 | – |
| 3 | 1 | 4 | 0 | – | 1 | 3 | 1 | 5 | 1 | 4 | 0 | – | 0 | – | 0 | – |

FIG.5B

| ADDRESS | T1 | | T2 | | T3 | | T4 | | T5 | | T6 | | T7 | | T8 | |
|---|---|---|---|---|---|---|---|---|---|---|---|---|---|---|---|---|
| 0 | 1 | 0 | 0 | – | 1 | 2 | 0 | – | 1 | 0 | 1 | 2 | 0 | – | 1 | 2 |
| 1 | 1 | 0 | 1 | 3 | 1 | 0 | 1 | 0 | 0 | – | 0 | – | 1 | 2 | 1 | 3 |
| 2 | 1 | 3 | 1 | 4 | 0 | – | 1 | 0 | 1 | 0 | 1 | 3 | 1 | 0 | 1 | – |
| 3 | – | – | – | – | – | – | – | – | – | – | – | – | – | – | – | – |

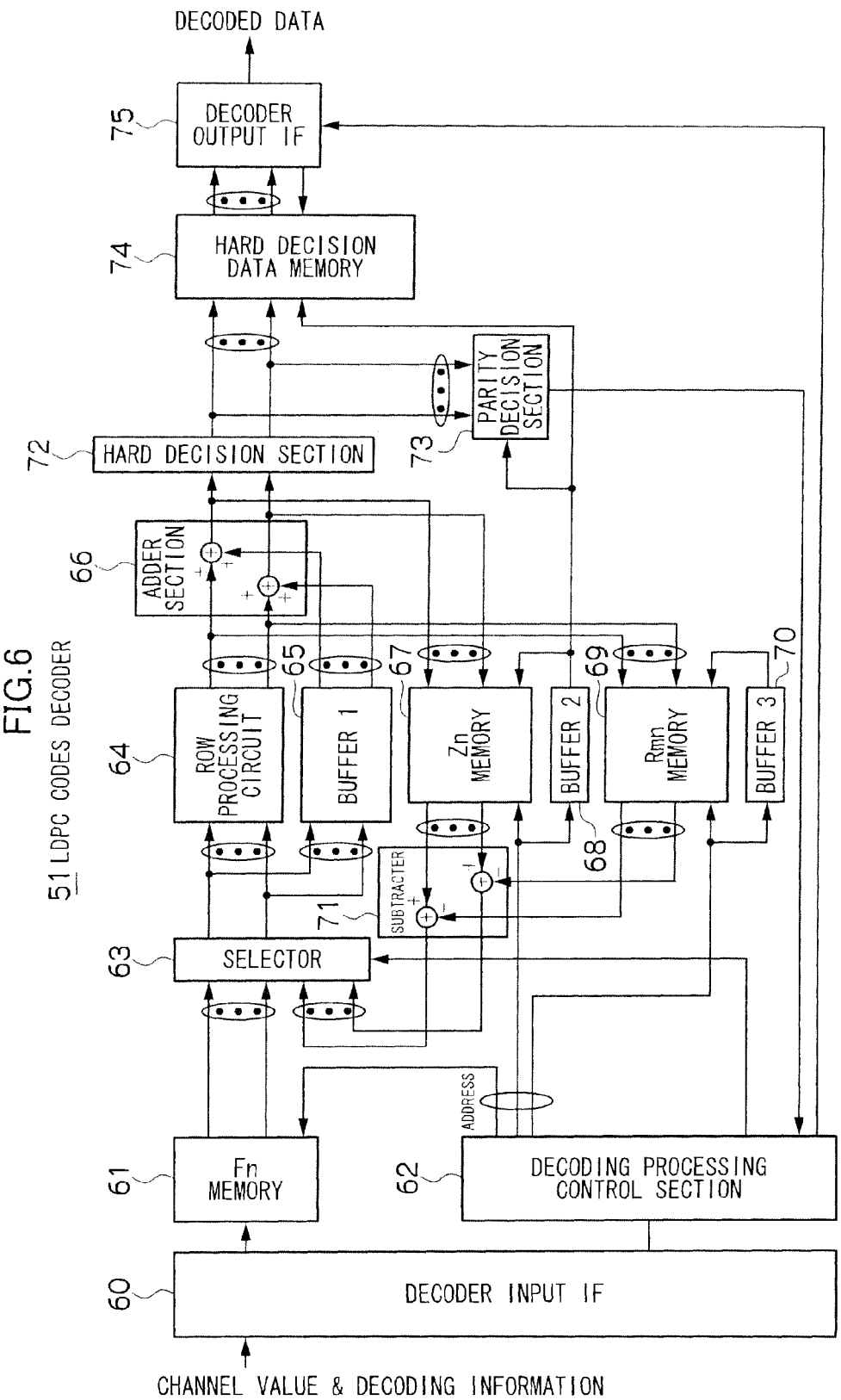

| ROW NUMBER | WAIT CYCLE |
|---|---|
| 0 | L-3 |
| 1 | 0 |
| 2 | 0 |
| 3 | 0 |
| 4 | 0 |
| 5 | 0 |
| 6 | L |
| 7 | 0 |
| 8 | 0 |
| 9 | 0 |
| 10 | 0 |
| 11 | 0 |
| 12 | L-3 |
| 13 | 0 |
| 14 | 0 |
| 15 | 0 |
| 16 | 0 |
| 17 | 0 |

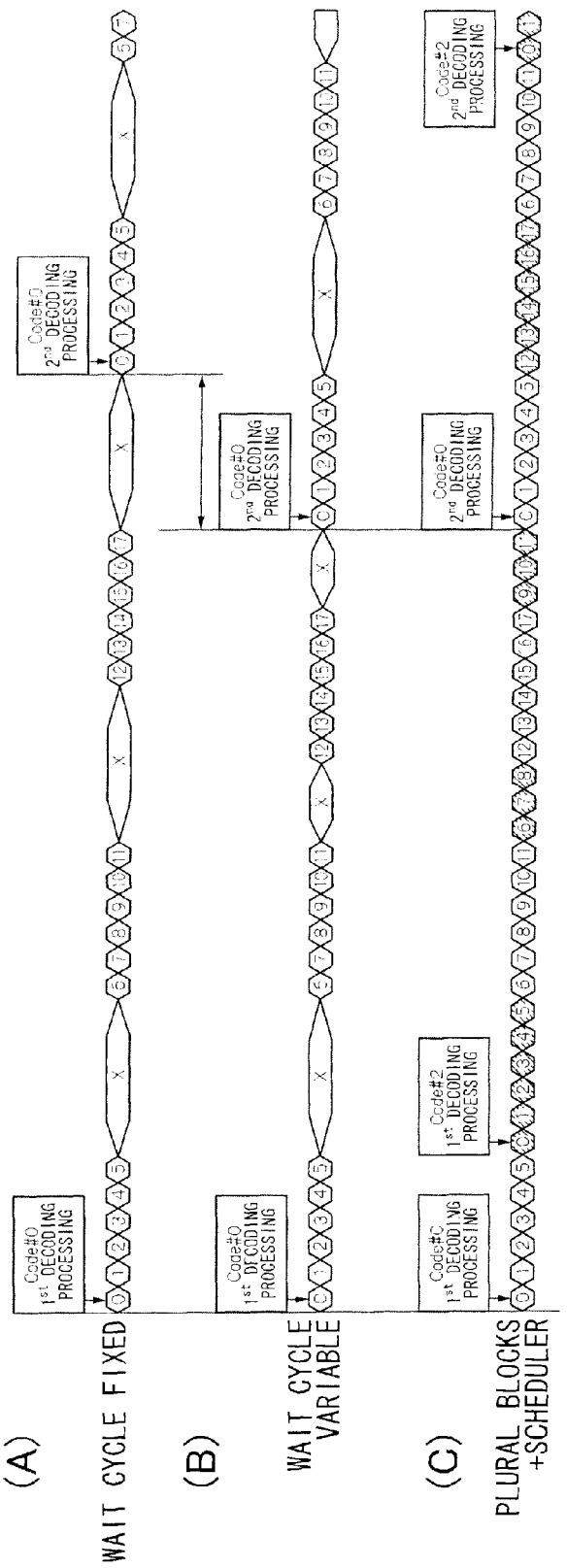

LOW DENSITY PARITY CHECK CODES DECODER AND METHOD THEREOF

CROSS-REFERENCE TO RELATED APPLICATIONS

This application is a Divisional of U.S. application Ser. No. 11/890,511, filed Aug. 7, 2007, now U.S. Pat. No. 8,028,214, which is based upon and claims the benefit of priority from prior Japanese Patent Application No. 2006-222531, filed Aug. 17, 2006 and Japanese Patent Application No. 2006-224431, filed Aug. 21, 2006, the entire contents of which are incorporated herein by reference.

BACKGROUND OF THE INVENTION

The present invention relates to a low density parity check (LDPC) codes decoder and a method thereof. The present invention is adapted to deal with LDPC codes with various coding rates by the same configuration. The present invention is also adapted to improve processing throughput without degrading the quality.

Document 1: R. G. Gallager, "Low-Density Parity-Check Codes", IRE Trans. Info. Theory, vol. IT-8, pp. 21-28, 1962

Document 2: A. J. Blanksby and C. J. Howland, "A 690-mW 1-Gb/s 1024-b, Rate-1/2 Low-Density Parity-Check Code Decoder," IEEE J. Solid-State Circuits, vol. 37, pp. 404-412, March 2002

Document 3: Y. Chen and D. Hocevar, "A FPGA and ASIC Implementation of Rate 1/2, 8088-b Irregular Low Density Parity Check Decoder," IEEE GLOBECOM2003, pp. 113-117, 2003

Document 4: M. M. Mansour and N. R. Shanbhag, "High-Throughput LDPC Decoder," IEEE Trans. VLSI Systems, vol. 11, No. 6, December 2003

As a decoding algorithm for LDPC codes, a Belief Propagation (BP) algorithm is known (refer to Document 1). The BP algorithm is a belief propagation algorithm in which the reliability is updated by iterating the row processing (check node processing) shown in Equations (1) to (3) and the column processing (variable node processing) shown in Equations (4) and (5) (refer to Document 3). Meanwhile, Equations (4) and (5) are combined into Equation (6):

[Row Processing]

$$L_{mn}^i = Z_n^{i-1} - R_{mn}^{i-1} \quad (1)$$

$$R_{mn}^i = \left\{ \prod_{j \in A(m) \backslash n} \text{Sign}(L_{mj}^i) \right\} \left[ -\psi \left\{ \sum_{j \in A(m) \backslash n} \psi(L_{mj}^i) \right\} \right] \quad (2)$$

$$\psi(x) = \ln(\tan h(|x/2|)) \quad (3)$$

[Column Processing]

$$S_n^i = \sum_{m \in B(n)} R_{mn}^i \quad (4)$$

$$Z_n^i = F_n + S_n^i \quad (5)$$

[Column Processing]

$$Z_n^i = F_n + \sum_{m \in B(n)} R_{mn}^i \quad (6)$$

where i is the number of times of decoding iteration, $Z_n^i$ is a log likelihood ratio (LLR) after decoding processing has been executed i times at the nth bit, $F_n$ is a channel data, and $R_{mn}^i$ is a row processing result after decoding processing has been executed i times at the nth bit on row m (initial values $Z_n^0 = F_n$, $R_{mn}^0 = 0$).

In Document 2, in which an architecture for a decoder applying the BP algorithm is shown, it has been reported that a throughput of 1 Gb/s at the maximum can be achieved by adopting a design for executing fully parallel processing of row processing and column processing (fully parallel design) at the time of decoding an LDPC code with a code length of 1024 bits and R=1/2. However, in such a design, LDPC codes with different check matrices cannot be decoded.

On the other hand, a Structured LDPC code is an LDPC code consisting of a base matrix (basic check matrix) of Mb rows and Nb columns and a permutation matrix of R rows and R columns (refer to FIG. 4 described later), and by changing the permutation matrix size R, it is possible to form check matrices for codes with different code lengths. By using a zero matrix or a cyclic shift matrix as a permutation matrix and holding only information on Mb×Nb shift values, locations of 1 on the check matrix can be identified easily. In Document 3, a decoder using the Structured LDPC code (hereinafter referred to as a structured LDPC code) is reported, and codes with different code lengths can be decoded due to the configuring method of the reported decoder.

Each of the LDPC codes with different coding rates has the different number of rows, different number of columns, and different number of variable node degrees.

In the configuring method of the decoder proposed in Document 3, LDPC codes with different coding rates cannot be decoded without changing the circuit configuration.

Also, in the decoding method to which the BP algorithm has been applied, the LLR is adapted to be updated per decoding iteration as shown in the above equations.

On the other hand, the Turbo Decoding Message Passing (TDMP) algorithm shown in Document 4 is an algorithm in which i in aforementioned Equations (1) to (4) is not the number of times of decoding iteration but time (cycle) when the mth row is processed. That is, the LLR is updated per row processing. Since the TDMP algorithm is excellent in convergence characteristics, it is known that it obtains equivalent error characteristics with less number of times of iteration than the BP algorithm's.

However, in the TDMP algorithm, when a row is to be processed, the row cannot be processed until the processing of a row and a column containing the same bit node as one contained in the target row is completed.

Also, in the TDMP algorithm as well, decoding processing is executed as many times of iteration as set before the decoding processing is terminated. However, in a case where there are inherently few errors, decoding processing executed predetermined times of iteration may be in vain.

Further, when error detection is to be executed, it needs to be done while the decoding processing is interrupted. This causes a problem in which the decoding processing is delayed as much as it takes for the error detection processing, and in which the error detection processing cannot be done frequently.

BRIEF SUMMARY OF THE INVENTION

It is an object of the present invention to provide a low density parity check codes decoder that can decode an LDPC code with an arbitrary coding rate without changing the circuit configuration.

A low density parity check codes decoder according to the present invention for decoding a low density parity check code constituted by a base matrix of Mb (where Mb<=Mbmax) rows and Nb (where Nb<=Nbmax) columns and a permutation matrix of R rows and R columns as an element of said base matrix comprises (1) Nbmax data storage and column processing calculation sections for taking in and storing channel data in parallel and executing parallel column processing for permutation matrices on the same row of the base matrix in accordance with a BP algorithm, (2) a row processing calculation section for receiving column processing results of said all data storage and column processing calculation sections and executing row processing in accordance with the BP algorithm, and (3) a decoding control section for dividing inputted channel data per permutation matrix size R, giving them to said respective data storage and column processing calculation sections, then generating column addresses corresponding to said respective data storage and column processing calculation sections and a row address common to said all data storage and column processing calculation sections, giving them to said respective data storage and column processing calculation sections, letting said data storage and column processing calculation sections iterate row processing and column processing in accordance with the BP algorithm, and generating decoding data based on log likelihood ratios for said all data storage and column processing calculation sections at the time when the number of times of decoding iteration reaches a predetermined number of times, (3) said decoding control section includes (3-1) a parity check matrix information storing section for storing Mbmax× Nbmax validity/invalidity flags and shift amounts of permutation matrices that are cyclic shift matrices, each of whose validity/invalidity flag is valid, determined depending on a check matrix for a processing target low density parity check code, (3-2) a permutation matrix size storing section for storing a permutation matrix size R in the processing target low density parity check code, and (3-3) a base matrix row number storing section for storing the number of rows of a base matrix Mb in the processing target low density parity check code, (3-4) wherein said column addresses and said row address are generated by utilizing said validity/invalidity flags, said shift amounts, said permutation matrix size, and said number of rows of a base matrix, (4) wherein at least either each of said data storage and column processing calculation sections or said row processing calculation section has an invalidation means for invalidating processing in accordance with said invalid validity/invalidity flags.

It is another object of the present invention to provide a low density parity check (LDPC) codes decoder and a method thereof that can improve processing throughput without degrading the quality.

A low density parity check codes decoder according to the present invention is a low density parity check codes decoder to which an algorithm in which a decoding result is updated per row processing has been applied as a decoding algorithm for a low density parity check code, and comprises (1) a decoding processing means for executing decoding processing, (2) a processing wait information storing means for storing time information on a time period from time when a row before a target row starts decoding processing to time when the target row can start processing, determined depending on information on a check matrix for a low density parity check code to be decoded, and (3) a start instruction postponing means for instructing said decoding processing means to start decoding processing for the target row after waiting at least as long as the time information stored in said processing wait information storing means.

A low density parity check codes decoder according to the present invention is a low density parity check codes decoder for executing decoding processing of plural code blocks in parallel, and comprises (1) a decoding processing means for executing decoding processing, (2) a priority information storing means for storing priority information added to each of said code blocks, and (3) a processing code block determining means for determining a code block that said decoding processing means is to decode based on the priority information added to the plural code blocks that undergo decoding processing.

A low density parity check codes decoding method according to the present invention is a low density parity check codes decoding method to which an algorithm in which a decoding result is updated per row processing has been applied as a decoding algorithm for a low density parity check code, and (0) comprises (1) a decoding processing step for executing decoding processing, (2) a processing wait information storing step for storing time information on a time period from time when a row before a target row starts decoding processing to time when the target row can start processing, determined depending on information on a check matrix for a low density parity check code to be decoded, and (3) a start instruction postponing step for instructing said decoding processing step to start decoding processing for the target row after waiting at least as long as the time information stored in said processing wait information storing step.

A low density parity check codes decoding method according to the present invention is a low density parity check codes decoding method for executing decoding processing of plural code blocks in parallel, and (0) comprises (1) a decoding processing step for executing decoding processing, (2) a priority information storing step for storing priority information added to each of said code blocks, and (3) a processing code block determining step for determining a code block that said decoding processing step is to decode based on the priority information added to the plural code blocks that undergo decoding processing.

BRIEF DESCRIPTION OF THE DRAWINGS

FIG. 3 is a block diagram showing a detailed configuration of a row processing calculation section in FIG. 1.

FIG. 5 shows storage examples in the check matrix tables in the examples in FIG. 4.

FIG. 6 is a block diagram showing an entire configuration of an LDPC codes decoder according to a second embodiment.

FIG. 9 shows an example of a check matrix according to the second embodiment and a Wait cycle determined in terms of the check matrix.

FIG. 10 is a timing chart showing code blocks and rows that start processing for explaining the effect of the second embodiment.

DESCRIPTION OF THE PREFERRED EMBODIMENTS

(A) First Embodiment

Hereinafter, a first embodiment of a low density parity check (LDPC) codes decoder according to the present invention will be described in details with reference to the drawings.

(A-1) Configuration of the First Embodiment

Figure 1:
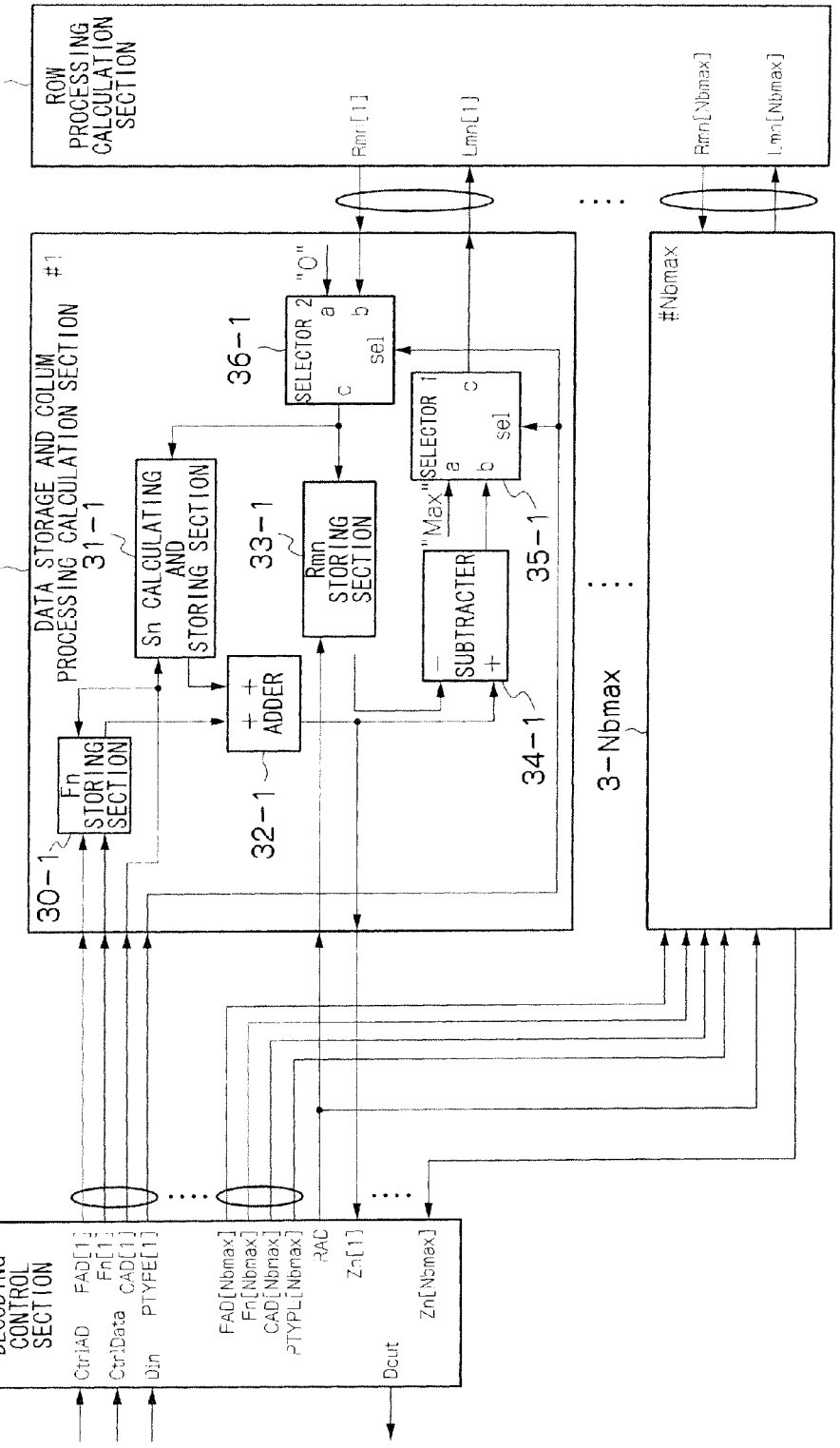
FIG. 1 is a block diagram showing an entire configuration of an LDPC codes decoder according to a first embodiment and a detailed configuration of a data storage and column processing calculation section.
Figure 2:
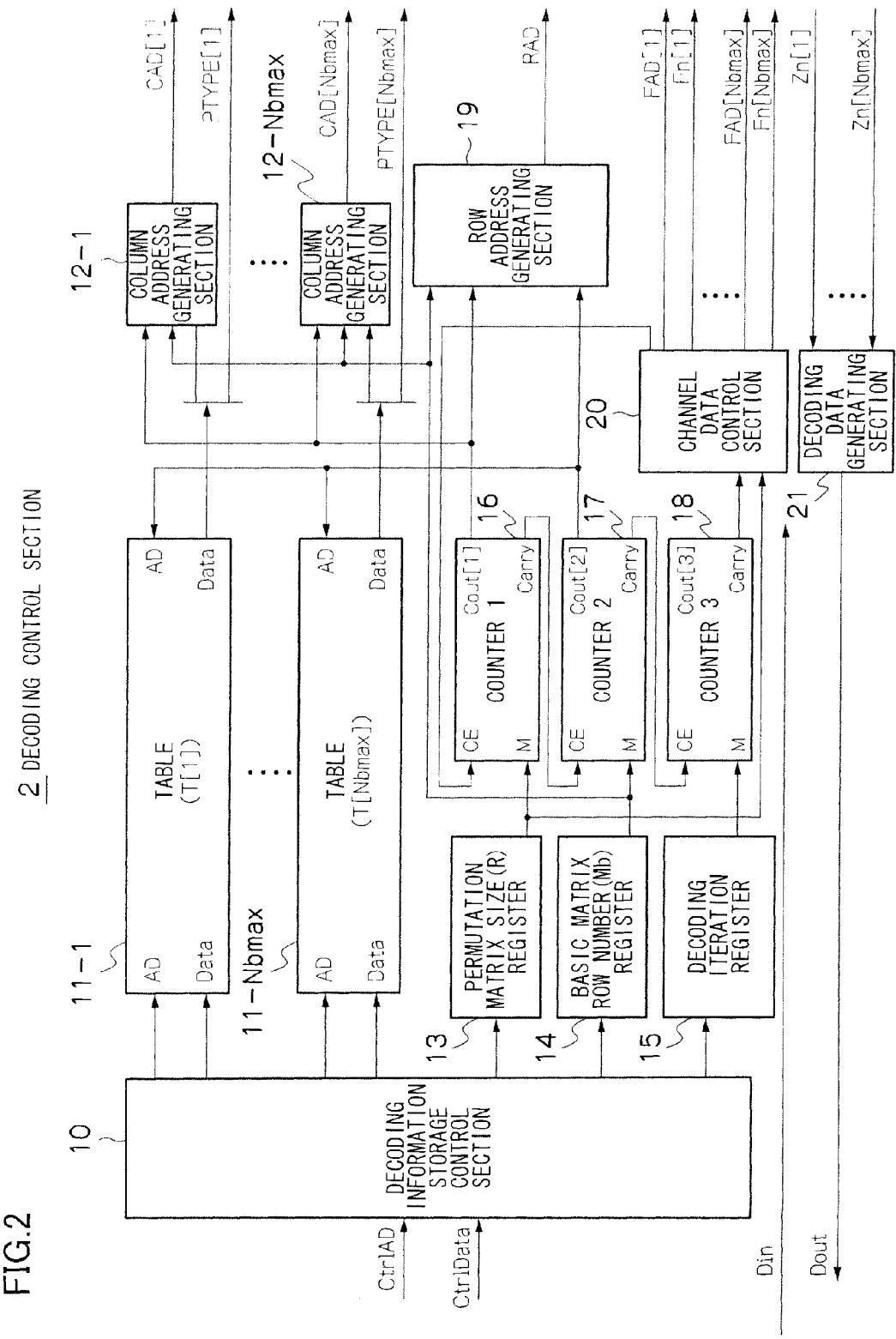
FIG. 2 is a block diagram showing a detailed configuration of a decoding control section in FIG. 1.

FIG. 1 is a block diagram showing an entire configuration of an LDPC codes decoder according to the first embodiment and a detailed configuration of a data storage and column processing calculation section, FIG. 2 is a block diagram showing a detailed configuration of a decoding control section in FIG. 1, and FIG. 3 is a block diagram showing a detailed configuration of a row processing calculation section in FIG. 1.

In FIG. 1, an LDPC codes decoder 1 of the first embodiment comprises a decoding control section 2, Nbmax (Nbmax is the maximum number of applicable columns in a base matrix.) data storage and column processing calculation sections 3-1 to 3-Nbmax, and a row processing calculation section 4.

The decoding control section 2 is adapted to execute control so as to deal with decoding of LDPC codes with different coding rates.

The decoding control section 2 includes a decoding information storage control section 10, Nbmax check matrix tables 11-1 to 11-Nbmax, Nbmax column address generating sections 12-1 to 12-Nbmax, a register 13 that stores a permutation matrix size (R), a register 14 that stores the number of rows (Mb) of a base matrix for a Structured LDPC code, a register 15 that stores the number of times of decoding iteration (i), three counters 16 to 18, a row address generating section 19, a channel data control section 20, and a decoding data generating section 21, as shown in FIG. 2.

The decoding information storage control section 10 is adapted to set data (CtrlData) coming from outside in any one among the check matrix tables 11-1 to 11-Nbmax, the permutation matrix size register 13, the base matrix row number register 14, or the decoding iteration register 15 determined according to an address (CtrlAD) coming parallel to the data.

A check matrix is adapted to be defined by all the information set in the check matrix tables 11-1 to 11-Nbmax. In each of the check matrix tables 11-1 to 11-Nbmax, information on Mb permutation matrix types (a zero matrix or a cyclic shift matrix) and shift values is stored. As for the permutation matrix type, "0" is made to correspond to the zero matrix, and "1" is made to correspond to the cyclic shift matrix, for example. Also, in a case where the number of columns Nb of the base matrix is smaller than the maximum number of applicable columns Nbmax, all the permutation matrix types in Nbmax−Nb check matrix tables are set to "0".

FIG. 4 shows check matrices for Structured LDPC codes with different code lengths and coding rates, and FIG. 5 shows storage examples in the check matrix tables in the examples in FIG. 4.

Figure 4A:
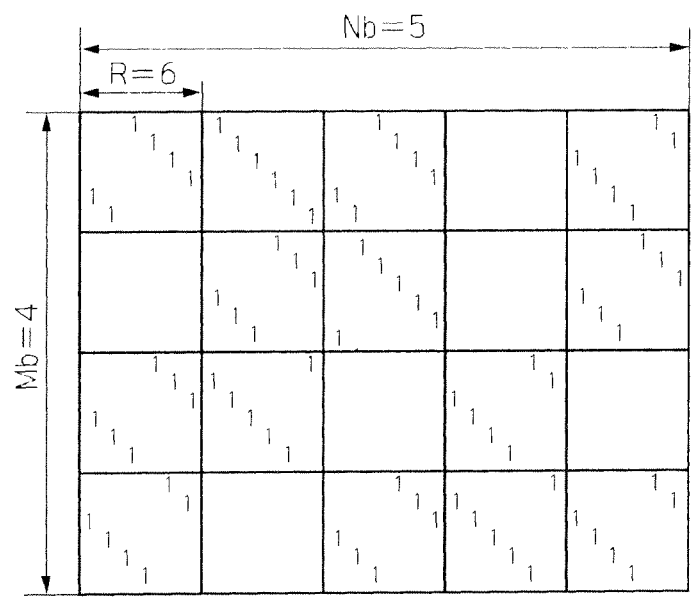
FIG. 4 shows check matrices for Structured LDPC codes with different code lengths and coding rates.
Figure 4B:
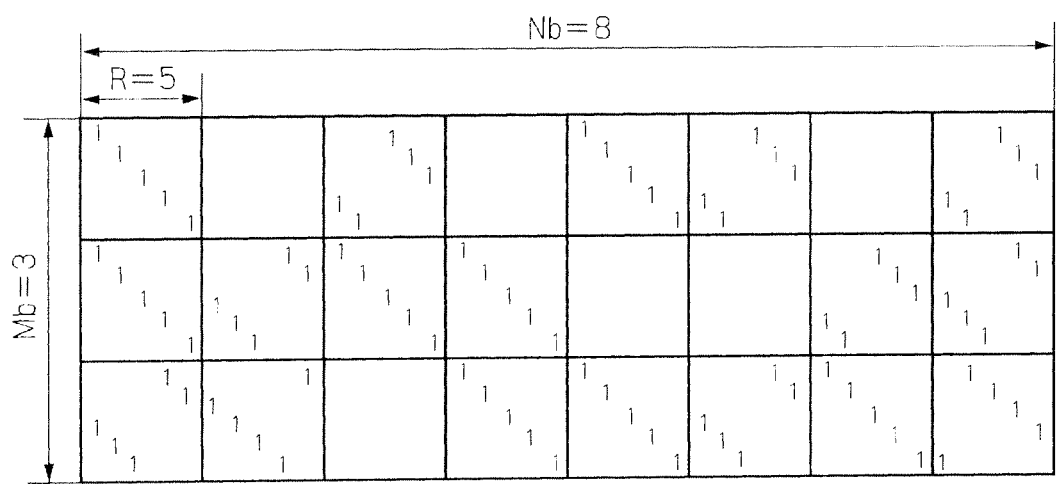

The base matrix of the check matrix shown in FIG. 4(A) is a 4×5 matrix, and the base matrix of the check matrix shown in FIG. 4(B) is a 3×8 matrix. Thus, in the case of an LDPC codes decoder supporting only these two check matrices, values of the maximum number of rows Mbmax and the maximum number of columns Nbmax only need to be 4 and 8, respectively.

Since the number of columns of the check matrix shown in FIG. 4(A) is 5, valid data is set in 5 check matrix tables 11-1 to 11-5 out of 8 (=Nbmax), and no valid data is set in the remaining 3 check matrix tables 11-6 to 11-8, as shown in FIG. 5(A). That is, "0" is put in each of the permutation matrix type fields of the check matrix tables 11-6 to 11-8.

The permutation matrix on the first row and first column is a cyclic shift matrix in which the column of the diagonal matrix on the diagonal of which the check bits "1" are located has been shifted by 2. Thus, in the address "0" in the check matrix table 11-1, "1" representing the cyclic shift matrix and "2" representing the shift value are stored. The permutation matrix on the second row and first column is a zero matrix. Thus, in the address "1" in the check matrix table 11-1, "0" representing the zero matrix is stored. The permutation matrix on the third row and first column is a cyclic shift matrix in which shift by 3 has been performed. Thus, in the address "2" in the check matrix table 11-1, "1" representing the cyclic shift matrix and "3" representing the cyclic shift value are stored. The permutation matrix on the fourth row and first column is a cyclic shift matrix in which shift by 4 has been performed. Thus, in the address "3" in the check matrix table 11-1, "1" representing the cyclic shift matrix and "4" representing the cyclic shift value are stored.

In the respective check matrix tables 11-2 to 11-5 as well, values corresponding to the permutation matrix types and the shift values for the check matrix shown in FIG. 4(A) are stored.

Since the number of columns of the check matrix shown in FIG. 4(B) is 8 (=Nbmax), valid data is set in all the check matrix tables 11-1 to 11-8, as shown in FIG. 5(B).

The permutation matrix on the first row and first column is a cyclic shift matrix in which no shift is performed. Thus, in the address "0" in the check matrix table 11-1, "1" representing the cyclic shift matrix and "0" representing the cyclic shift value are stored. The permutation matrix on the second row and first column is also a cyclic shift matrix in which no shift is performed. Thus, in the address "1" in the check matrix table 11-1, "1" representing the cyclic shift matrix and "0" representing the cyclic shift value are stored. The permutation matrix on the third row and first column is a cyclic shift matrix in which shift by 3 has been performed. Thus, in the address "2" in the check matrix table 11-1, "1" representing the cyclic shift matrix and "3" representing the cyclic shift value are stored. The base matrix of the check matrix shown in FIG. 4(B) has 3 rows and does not have the fourth row. Thus, in the address "3" in the check matrix table 11-1, no data is set.

In the respective check matrix tables 11-2 to 11-8 as well, values corresponding to the permutation matrix types and the shift values for the check matrix shown in FIG. 4(B) are stored.

The permutation matrix size register 13 is adapted to store the size of the permutation matrix (R), the base matrix row number register 14 is adapted to store the number of rows of the base matrix (Mb), and the decoding iteration register 15 is adapted to store the number of times of decoding iteration.

The permutation matrix size R stored in the permutation matrix size register 13 is supplied to the counter 16 and the channel data control section 20. The base matrix row number Mb stored in the base matrix row number register 14 is supplied to the column address generating sections 12-1 to 12-Nbmax, the counter 17, and the row address generating section 19. The number of times of decoding iteration stored in the decoding iteration register 15 is supplied to the counter 18.

In the case of the check matrix shown in FIG. 4(A), "6" is stored in the permutation matrix size register 13, and "4" is stored in the base matrix row number register 14. Also, in the case of the check matrix shown in FIG. 4(B), "5" is stored in the permutation matrix size register 13, and "3" is stored in the base matrix row number register 14.

The counter 16 is adapted to function as a cyclic counter for the permutation matrix size (R) set in the permutation matrix size register 13. It is adapted to be provided with a trigger signal (CE) for count-up from the channel data control section 20, supply the count value Cout [1] to all the column address generating sections 12-1 to 12-Nbmax and the row address generating section 19, and supply a carry signal to the counter 17 as a trigger signal.

The counter 17 is adapted to function as a cyclic counter for the number of rows of the base matrix (Mb) set in the base matrix row number register 14. It is adapted to supply a count value Cout [2] to all the check matrix tables 11-1 to 11-Nbmax as a read-out address, supply it to the row address generating section 19 as a value representing a processing target row of the check matrix, and supply a carry signal to the counter 18 as a trigger signal.

The counter 18 is adapted to function as a counter (cyclic counter) for the number of times of decoding iteration (i) set in the decoding iteration register 15. It is adapted to supply a carry signal to the channel data control section 20.

The channel data control section 20 is adapted to control supply of channel data Din to the data storage and column processing calculation sections 3-1 to 3-Nbmax. The channel data control section 20 is adapted to control division of the channel data Din that newly undergoes decoding processing when a carry signal is outputted from the counter 18. To the channel data control section 20 is inputted the channel data Din buffered by a buffer section (not shown). In a case where the number of columns Nb of the base matrix is smaller than the maximum number of columns Nbmax, as many dummy data as the difference of the number of columns, Nbmax−Nb, are inserted in the buffered channel data Din. The channel data control section 20 divides the channel data Din per permutation matrix size (R) stored in the permutation matrix size register 13, transmits Nbmax data Fn [1] to Fn [Nbmax] obtained through the division as well as the addresses FAD [1] to FAD [Nbmax] to the data storage and column processing calculation sections 3-1 to 3-Nbmax in parallel, and lets the sections store them in their respective Fn storing sections 30. It thereafter iterates the same division and parallel transmission processing.

The aforementioned counter 16 is adapted to count up in response to a trigger signal (CE) outputted each time the channel data control section 20 transmits each of the Nbmax data Fn [1] to Fn [Nbmax]. The count value Cout [1] of the counter 16 is adapted to define a processing target row within the permutation matrix.

The count value Cout [2] of the counter 17, which receives a carry signal from the counter 16 as a trigger signal, is adapted to define a processing target row within the base matrix (location of a targeted permutation matrix).

The row address generating section 19 is adapted to generate row addresses based on the count values of the counters 16 and 17 and give them to the data storage and column processing calculation sections 3-1 to 3-Nbmax described later. The counter 16 calculates the permutation matrix size R, and the counter 17 calculates the number of rows Mb as triggered by a carry signal from the counter 16, which causes the row address generating section 19 to generate row addresses so that as many row processing operations as the number of rows derived by multiplying the permutation matrix size R by the number of rows Mb are executed per decoding iteration.

To the check matrix tables 11-1 to 11-Nbmax is given the count value Cout [2] of the counter 17 as a read-out address, and the check matrix tables 11-1 to 11-Nbmax respectively output stored data corresponding to the read-out address.

As illustrated in FIG. 5, the stored data in the check matrix tables 11-1 to 11-Nbmax consists of information on the permutation matrix types (a zero matrix or a cyclic shift matrix) and the shift values. Data of the permutation matrix types PTYPE [1] to PTYPE [Nbmax] are given to the corresponding data storage and column processing calculation sections 3-1 to 3-Nbmax.

To the respective column address generating sections 12-1 to 12-Nbmax are given the stored data of the corresponding check matrix tables 11-1 to 11-Nbmax and the count value Cout [1] of the counter 16. In response to these input data, the respective column address generating sections 12-1 to 12-Nbmax are adapted to give column addresses CAD [1] to CAD [Nbmax] for locations where "1" is located at a processing target row within permutation matrices which are cyclic shift matrices to the corresponding data storage and column processing calculation sections 3-1 to 3-Nbmax.

For example, in the case of the check matrix shown in FIG. 4(A) (table contents shown in FIG. 5(A)), when the count value Cout [2] of the counter 17 is "0", data at the address "0" shown in FIG. 5(A) are outputted from the respective check matrix tables 11-1 to 11-8. The permutation matrix type "1" (=PTYPE [1]) outputted from the check matrix table 11-1 is outputted to the corresponding data storage and column processing calculation section 3-1. When the count value Cout [1] of the counter 16 is "2" representing the third column in this case, the column address generating section 12-1 outputs the column address CAD [1] representing that the third column is valid based on the shift value "2" and the count value Cout [1]=2.

The decoding data generating section 21 is adapted to execute hard decision on the log likelihood ratios Zn [1] to Zn [Nbmax] calculated by all the data storage and column processing calculation sections 3-1 to 3-Nbmax when column processing and row processing are iterated as many times as the number of times of decoding iteration (i) stored and generate decoding data Dout.

Each of the data storage and column processing calculation sections 3-1 to 3-Nbmax is adapted to hold channel data and execute the aforementioned column processing. The respective data storage and column processing calculation sections 3-1 to 3-Nbmax are adapted to execute column processing for the first to Nbmaxth permutation matrices on the base matrix.

The respective data storage and column processing calculation sections 3-1 to 3-Nbmax include Fn storing sections 30-1 to 30-Nbmax, Sn calculating and storing sections 31-1 to 31-Nbmax, adders 32-1 to 32-Nbmax, Rmn storing sections 33-1 to 33-Nbmax, subtracters 34-1 to 34-Nbmax, first selectors 35-1 to 35-Nbmax, and second selectors 36-1 to 36-Nbmax, as shown in FIG. 1 in terms of the data storage and column processing calculation section 3-1. The following explanation on the components will be done in terms of the data storage and column processing calculation section 3-1 as a representative example.

The Fn storing section 30-1 is adapted to store the channel data Fn [1] supplied from the decoding control section 2. The Fn storing section 30-1 is also adapted to read out the channel data stored in the area of the column address CAD [1] supplied from the decoding control section 2 and give it to the adder 32-1. The channel data read out corresponds to $F_n$ in aforementioned Equation (5).

The Sn calculating and storing section 31-1 is adapted to derive an Sn value from the Rmn [1] given via the second selector 36-1 in accordance with aforementioned Equation (4) and store the derived Sn value. The Sn calculating and storing section 31-1 is also adapted to readout the Sn value stored in the area of the column address CAD [1] supplied from the decoding control section 2 and give it to the adder 32-1.

The adder 32-1 is adapted to add the given two values. This addition means calculation of aforementioned Equation (5). The value Zn [1] resulting from the addition is given to the decoding control section 2 and the subtracter 34-1 as a subtracted input.

The Rmn storing section 33-1 is adapted to store the Rmn [1] given via the second selector 36-1. The Rmn storing section 33-1 is also adapted to read out the value stored in the area of the row address RAD supplied from the decoding control section 2 and give it to the subtracter 34-1 as a subtracting input.

The subtracter 34-1 is adapted to subtract the read-out value of the Rmn storing section 33-1 from the input from the adder 32-1, and this subtraction corresponds to calculation in aforementioned Equation (1).

To the first selector 35-1 are given the output value of the subtracter 34-1 and the maximum value Max that the input data to the row processing calculation section 4 can become as selection inputs and is given the permutation matrix type data PTYPE [1] from the decoding control section 2 as a selection control signal. The first selector 35-1 selects the output value of the subtracter 34-1 when the permutation matrix type data PTYPE [1] is "1" and selects the maximum value Max when the permutation matrix type data PTYPE [1] is "0" and outputs the selected value Lmn [1] to the row processing calculation section 4.

To the second selector 36-1 are given the value Rmn given from the row processing calculation section 4 and "0" as selection inputs and is given the permutation matrix type data PTYPE [1] from the decoding control section 2 as a selection control signal. The second selector 36-1 selects the value Rmn given from the row processing calculation section 4 when the permutation matrix type data PTYPE [1] is "1" and selects "0" when the permutation matrix type data PTYPE [1] is "0" and outputs the selected value to the Sn calculating and storing section 31-1 and the Rmn storing section 33-1.

The row processing calculation section 4 includes absolute value/sign separating sections 40-1 to 40-Nbmax, first Gallager tables 41-1 to 41-Nbmax, an adder tree 42, subtracters 43-1 to 43-Nbmax, second Gallager tables 44-1 to 44-Nbmax, an exclusive OR circuit tree 45, exclusive OR circuits (XORs) 46-1 to 46-Nbmax, and integer converting sections 47-1 to 47-Nbmax, as shown in FIG. 3. The row processing calculation section 4 shown in FIG. 3 is equivalent to one described in aforementioned Document 3 and is adapted to perform calculation of aforementioned Equation (2).

The respective absolute value/sign separating sections 40-1 to 40-Nbmax are adapted to separate the values Lmn [1] to Lmn [Nbmax] given from the corresponding data storage and column processing calculation sections 3-1 to 3-Nbmax into signs and absolute values, give the separated absolute values to the corresponding first Gallager tables 41-1 to 41-Nbmax, and give the separated signs to the exclusive OR circuit tree 45 and the corresponding exclusive OR circuits 46-1 to 46-Nbmax. The separated sign is "0" in the case of a positive number and "1" in the case of a negative number.

The right-hand side of aforementioned Equation (2) consists of a calculation part relating to a sign and a calculation part relating to an absolute value when Equation (3) is considered. The first Gallager tables 41-1 to 41-Nbmax, the adder tree 42, the subtracters 43-1 to 43-Nbmax, and the second Gallager tables 44-1 to 44-Nbmax are adapted to perform the calculation parts relating to absolute values, the exclusive OR circuit tree 45 and the exclusive OR circuits (XORs) 46-1 to 46-Nbmax are adapted to perform the calculation parts relating to signs, and the integer converting sections 47-1 to 47-Nbmax are adapted to combine the two kinds of calculation parts to form output values.

The respective first Gallager tables 41-1 to 41-Nbmax are look-up tables that perform calculation shown in Equation (3) for the inputted absolute values and are adapted to give the calculation results to the adder tree 42 and the corresponding subtracters 43-1 to 43-Nbmax. Meanwhile, the respective first Gallager tables 41-1 to 41-Nbmax (and 44-1 to 44-Nbmax) are adapted to be look-up tables each of whose outputs is 0 when the input is the maximum value that each of the aforementioned first selectors 35-1 to 35-Nbmax can select.

The adder tree 42 is adapted to derive a total sum of the outputs from all the first Gallager tables 41-1 to 41-Nbmax, and each of the subtracters 43-1 to 43-Nbmax is adapted to subtract a value of the corresponding one of the first Gallager tables 41-1 to 41-Nbmax from the total sum. For example, the output of the subtracter 43-1 is a total sum of the Nbmax−1 outputs from the first Gallager tables 41-2 to 41-Nbmax derived by subtracting the output of the corresponding first Gallager table 41-1, where the total sum calculation in Equation (2) where n=1 is performed.

The respective second Gallager tables 44-1 to 44-Nbmax are look-up tables that perform calculation shown in Equation (3) for the outputs from the subtracters 43-1 to 43-Nbmax and are adapted to give the calculation results to the corresponding integer converting sections 47-1 to 47-Nbmax.

The exclusive OR circuit tree 45 is adapted to derive multiplication of the signs from all the absolute value/sign separating sections 40-1 to 40-Nbmax, and each of the exclusive OR circuits 46-1 to 46-Nbmax is adapted to obtain multiplication of the sign from the corresponding one of the absolute value/sign separating sections 40-1 to 40-Nbmax by the multiplication of all the signs (that is equal to division of the multiplication of all the signs by the sign from the corresponding one of the absolute value/sign separating sections 40-1 to 40-Nbmax). For example, the output of the exclusive OR circuit 46-1 is multiplication of the Nbmax−1 signs of the absolute value/sign separating sections 40-2 to 40-Nbmax derived by subtracting the sign of the corresponding absolute value/sign separating section 40-1, where the sign side calculation in Equation (2) where n=1 is performed.

The respective integer converting sections 47-1 to 47-Nbmax are adapted to add the signs given from the corresponding exclusive OR circuits 46-1 to 46-Nbmax to the values given from the corresponding second Gallager tables 44-1 to 44-Nbmax so as to make them integers and output the obtained values Rmn [1] to Rmn [Nbmax] to the corresponding data storage and column processing calculation sections 3-1 to 3-Nbmax. By the processing of each of the integer converting sections 47-1 to 47-Nbmax, calculation shown in Equation (2) is completed.

(A-2) Operation of the First Embodiment

Next, the operation of the LDPC codes decoder 1 according to the first embodiment constituted as shown in aforementioned FIGS. 1 to 3 will be explained.

(S1) First, data in accordance with a check matrix to be used are set in the check matrix tables 11-1 to 11-Nbmax, the permutation matrix size register 13, the base matrix row number register 14, and the decoding iteration register 15 via the decoding information storage control section 10.

In a case where the maximum number of applicable columns in the base matrix (Nbmax) is 8, and when a check matrix to be used is one shown in FIG. 4(A), for example, the contents shown in FIG. 5(A) are set in the check matrix tables 11-1 to 11-8, "6" is set in the permutation matrix size register 13, and "4" is set in the base matrix row number register 14. Also, when a check matrix to be used is one shown in FIG. 4(B), for example, the contents shown in FIG. 5(B) are set in the check matrix tables 11-1 to 11-8, "5" is set in the permutation matrix size register 13, and "3" is set in the base matrix row number register 14. The number of times of decoding iteration is arbitrarily set regardless of which check matrix is used.

(S2) Next, the channel data control section 20 divides the inputted channel data Din per R pieces, which is the permutation matrix size, set in the permutation matrix size register 13 and lets them written in the Fn storing sections 30-1 to 30-Nbmax of the data storage and column processing calculation sections 3-1 to 3-Nbmax.

(S3) Subsequently, the row address generating section 19, the column address generating sections 12-1 to 12-Nbmax, and so on generate an address of a processing target row RAD, Nbmax column addresses CAD [1] to CAD [Nbmax], and the permutation matrix types PTYPE [1] to PTYPE [Nbmax] based on the values Cout [1] and Cout [2] of the counters 16 and 17 and output them to the data storage and column processing calculation sections 3-1 to 3-Nbmax.

(S4) In the respective data storage and column processing calculation sections 3-1 to 3-Nbmax, read-out from the Fn storing sections 30-1 to 30-Nbmax, the Sn calculating and storing sections 31-1 to 31-Nbmax, and the Rmn storing sections 33-1 to 33-Nbmax is conducted to perform calculations of aforementioned Equations (5) and (1) based on the inputted row address RAD and column addresses CAD [1] to CAD [Nbmax], and input data Lmn [1] to Lmn [Nbmax] to the row processing calculation section 4 are generated based on the inputted permutation matrix type data PTYPE [1] to PTYPE [Nbmax]. When the permutation matrix type data is "0", the maximum value Max that the corresponding one of the input data Lmn [1] to Lmn [Nbmax] to the row processing calculation section 4 can become is outputted instead of the calculated value.

(S5) The row processing calculation section 4 performs calculation of aforementioned Equation (2) based on the data Lmn [1] to Lmn [Nbmax] inputted from the respective data storage and column processing calculation sections 3-1 to 3-Nbmax. The respective first Gallager tables 41-1 to 41-Nbmax are adapted to be tables each of whose outputs is 0 when the input is the maximum value. Thus, only the row processing result for a column whose permutation matrix type is "1" corresponds to the result derived from Equation (2).

(S6) The respective data storage and column processing calculation sections 3-1 to 3-Nbmax calculates the Sn values shown in Equation (4), using the row processing results Rmn [1] to Rmn [Nbmax] outputted from the row processing calculation section 4 and the permutation matrix types PTYPE [1] to PTYPE [Nbmax]. As the row processing results Rmn [1] to Rmn [Nbmax] of the row processing calculation section 4 when the permutation matrix type is "0" are indefinite, the second selectors 36-1 to 36-Nbmax substitute 0 for the row processing result values Rmn [1] to Rmn [Nbmax]. Then, they are stored in the Rmn storing sections 33-1 to 33-Nbmax, and in the Sn calculating and storing sections 31-1 to 31-Nbmax, addition of the output values from the second selectors 36-1 to 36-Nbmax is performed to perform calculation of Equation (4).

(S7) After the above processing (S3) to (S6) is iterated as many times as the number of times of decoding iteration stored in the decoding iteration register 15, the decoding data generating section 21 in the decoding control section 2 executes hard decision on the log likelihood ratios Zn [1] to Zn [Nbmax] calculated by all the data storage and column processing calculation sections 3-1 to 3-Nbmax and generates decoding data Dout.

(A-3) Effect of the First Embodiment

According to the LDPC codes decoder of the above first embodiment, an arbitrary structured LDPC code whose base matrix is Mb×Nb (Note that Mb<=Mbmax, Nb=Nbmax.) can be decoded. That is, an LDPC code with an arbitrary coding rate can be decoded without changing the configuration.

Since data representing validity/invalidity to correspond to an arbitrary structured LDPC code are configured and stored as shown in FIG. 5, data volume can be suppressed, and memory configuration etc. can be miniaturized.

(A-4) Modified Example of the First Embodiment

In the first embodiment, data from outside are set in the check matrix tables 11-1 to 11-Nbmax, the permutation matrix size register 13, and the base matrix row number register 14 to deal with a structured LDPC code having an arbitrary base matrix. However, several sets of the check matrix tables 11-1 to 11-Nbmax, the permutation matrix size register 13, and the base matrix row number register 14 that have stored data therein may be prepared in advance, and one of these sets may be designated from outside so as to deal with a structured LDPC code having an arbitrary base matrix.

Also, in the first embodiment, a component that inserts dummy data to the channel data in accordance with the number of columns Nb of the base matrix is provided outside the LDPC codes decoder. However, the LDPC codes decoder may take in the number of columns Nb of the base matrix as well from outside and insert dummy data in accordance with it.

Meanwhile, the configuration of the row processing calculation section may be anything as far as calculation of Equation (2) can be performed and is not limited to one shown in FIG. 3. Also, t may be one that can perform calculation of an approximate equation to Equation (2). The calculation of such an approximate equation and the configuration by which it can be performed are described in Document 5: "Near optimum universal belief propagation based decoding of low-density parity check codes," IEEE Trans. Commun., vol. 50, pp. 406-414, March 2002, for example.

Also, the number of times of decoding (i) may be one that cannot be arbitrarily set but is a fixed number. Further, the LDPC codes decoder may be configured so that either the number of rows Mb or the number of columns Nb of the base matrix cannot be arbitrarily set.

Further, the first selectors 35-1 to 35-Nbmax and the second selectors 36-1 to 36-Nbmax may be provided as components of the row processing calculation section 4.

(B) Second Embodiment

Hereinafter, a second embodiment of a low density parity check (LDPC) codes decoder and a method thereof according to the present invention will be described in details with reference to the drawings.

(B-1) Configuration of the Second Embodiment

Figure 7:
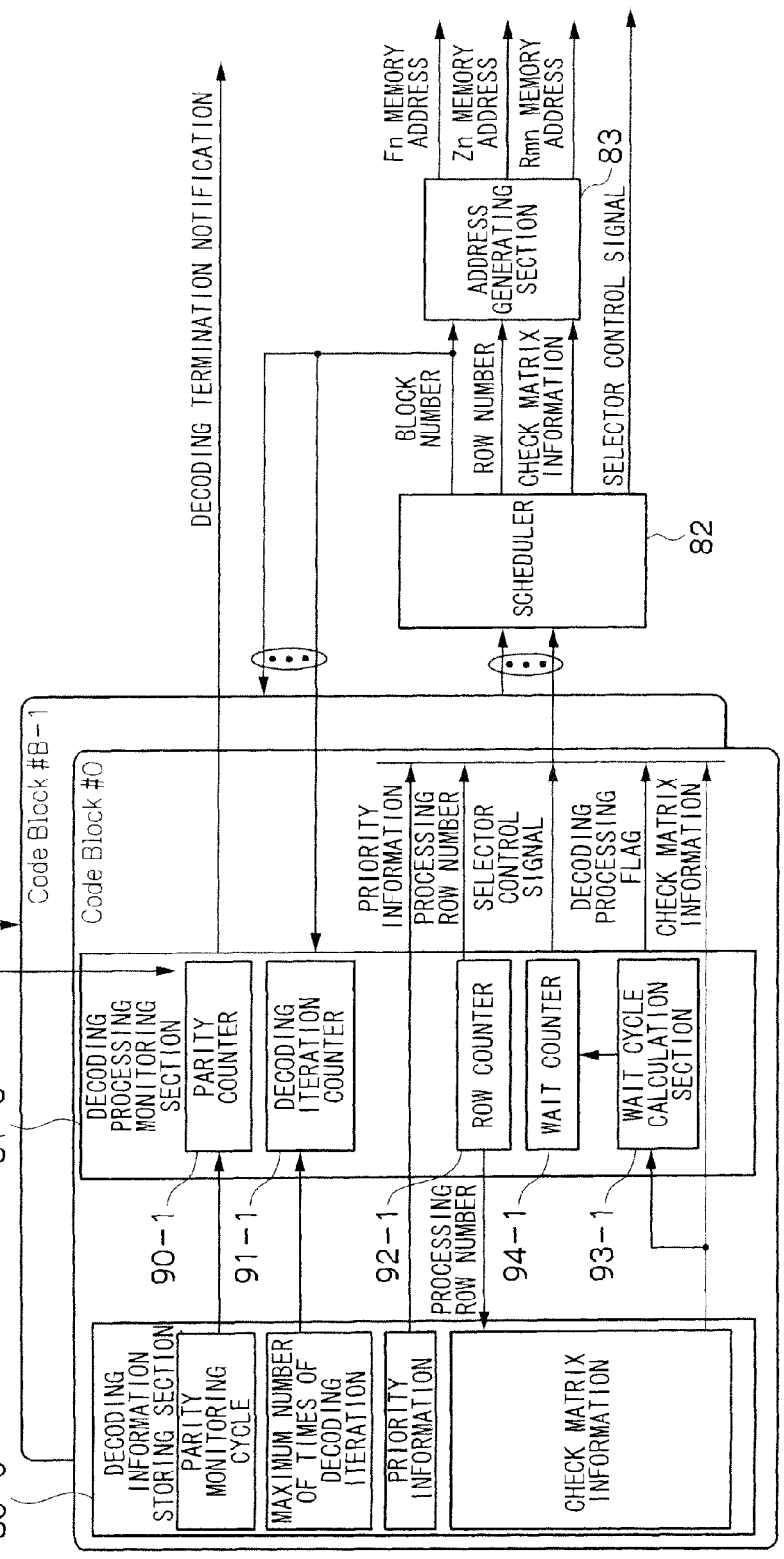
FIG. 7 is a block diagram showing a detailed configuration of a decoding processing control section according to the second embodiment.

FIG. 6 is a block diagram showing an entire configuration of an LDPC codes decoder according to the second embodiment, and FIG. 7 is a block diagram showing a detailed configuration of a decoding processing control section in FIG. 6.

In FIG. 6, an LDPC codes decoder 51 of the present embodiment includes a decoder input interface section (decoder input IF) 60, an Fn memory 61, a decoding processing control section 62, a selector 63, a row processing circuit 64, a first buffer 65, an adder section 66, a Zn memory 67, a second buffer 68, an Rmn memory 69, a third buffer 70, a subtracter section 71, a hard decision section 72, a parity decision section 73, a hard decision data memory 74, and a decoder output interface section (decoder output IF) 75.

The decoder input interface section 60 is adapted to take in data (channel data) of each code block and decoding information on each code block and give the channel data to the Fn memory 61 and give the decoding information to the decoding processing control section 62.

Here, the code block is a block of data to be decoded by applying the same check matrix (decoding target). Thus, the LDPC codes decoder 51 of the second embodiment can decode plural code blocks in parallel in a time-shared manner. Also, the decoding information is (a) parity check matrix information, (b) maximum number of times of decoding iteration, (c) priority information, and (d) parity monitoring cycle. The parity check matrix information is information on a check matrix for the code block. The maximum number of times of decoding iteration is the upper limit of the number of times of iteration to iterate decoding processing. The priority information is information on priority regarding decoding processing among code blocks. The parity monitoring cycle is a pre-set value to be compared with the number of consecutive times of OK as a parity check result for a processed row and is used to terminate decoding processing when the number of consecutive times of OK reaches the parity monitoring cycle.

The Fn memory 61 is adapted to store a channel data given from outside via the decoder input interface section 60 and read out the stored channel data Fn and give it to the selector 63 under control of the decoding processing control section 62.

The decoding processing control section 62 functions to determine blocks and rows targeted for decoding processing and has a detailed configuration shown in FIG. 7. The detailed configuration of the decoding processing control section 62 will be described later.

The selector 63 is adapted to select data (channel data) read out from the Fn memory 61 or output data from the subtracter section 71 under control of the decoding processing control section 62 and give it to the row processing circuit 64 and the first buffer 65. The selector 63 selects data (channel data) read out from the Fn memory 61 in a case where aforementioned Equation (1) is calculated first (i−1=0) and in a case where the channel data Fn of a processing target row etc. is transferred to the first buffer 65.

The row processing circuit 64 is adapted to perform calculation of aforementioned Equation (2). In the second embodiment, the calculation method for matrix processing has no characteristics, and thus the detailed explanation is omitted. Calculation of Equation (3) required for calculation of Equation (2) may be performed by making use of a look-up table etc. Also, the row processing circuit 64 may perform calculation of an approximate equation to Equation (2) instead of calculation of Equation (2) itself. The row processing result Rmn by the row processing circuit 64 is given to the adder section 66 and the Rmn memory 69.

The first buffer 65 is adapted to buffer the channel data Fn required for calculation of aforementioned Equation (6) and control the timing when the channel data Fn is given to the adder section 66.

The adder section 66 consists of a plurality of adders and is adapted to add the row processing result Rmn from the row processing circuit 64 and the channel data Fn buffered in the first buffer 65. That is, the adder section 66 is adapted to perform aforementioned Equation (6). The column processing result Zn obtained from the adder section 66 is given to the Zn memory 67 and the hard decision section 72.

The Zn memory 67 is adapted to store the column processing result Zn supplied from the adder section 66 in the area of the address supplied from the decoding processing control section 62. The Zn memory 67 is also adapted to read out the column processing result Zn from the area of the address outputted from the second buffer 68 and give it to the subtracter section 71 as a subtracted input.

The second buffer 68 is adapted to buffer the address to be written in the Zn memory 67 to control the timing and give the buffered address to the Zn memory 67, the parity decision section 73, and the hard decision data memory 74.

The Rmn memory 69 is adapted to store the row processing result Rmn supplied from the row processing circuit 64 in the area of the address supplied from the decoding processing control section 62. The Rmn memory 69 is also adapted to read out the row processing result Rmn from the area of the address outputted from the third buffer 70 and give it to the subtracter section 71 as a subtracting input.

The third buffer 70 is adapted to buffer the address to be written in the Rmn memory 69 to control the timing and give the buffered address to the Rmn memory 69.

The subtracter section 71 consists of a plurality of subtracters and is adapted to subtract the row processing result Rmn read out from the Rmn memory 69 from the column processing result Zn read out from the Zn memory 67 and give it to the selector 63 as a selection input. That is, the subtracter section 71 is adapted to perform aforementioned Equation (1).

The hard decision section 72 is adapted to execute hard decision on the column processing result Zn outputted from the adder section 66 in accordance with Equation (7) described later and give the obtained hard decision data to the parity decision section 73 and the hard decision data memory 74.

The parity decision section 73 is adapted to execute error detection (parity decision) per decoding iteration based on the hard decision data from the hard decision section 72 and the address outputted from the second buffer 68. The address outputted from the second buffer 68 is one that the decoding processing control section 62 has formed by utilizing the code block targeted to be checked and the parity check matrix information as well, as described later. It contains parity check matrix information (bit node information) and can be used for error detection. The parity decision section 73 is adapted to give the parity decision result and the parity check block number to the decoding processing control section 62. Here, the parity decision section 73 holds information (e.g., table information) to convert the address outputted from the second buffer 68 into a parity check block number, which causes generation of the parity check block number. It is noted that the decoding processing control section 62 may have a function to convert the address into a parity check block number.

Error detection for an LDPC code can be done by deciding if HX=0 by using the check matrix H and the decoding result $X\hat{} = (\hat{x}1, \ldots, \hat{x}n, \ldots, \hat{x}N)$ on which hard decision has been executed as shown in Equation (7). That is, the maximum times of decoding processing may not be executed, but error detection for a processed row may be executed per decoding iteration, and if the error detection result is OK predetermined times consecutively, decoding processing may be terminated. In the present embodiment, which takes this respect into consideration, error detection (parity decision) for a processed row is executed per decoding iteration, and based on the parity decision result, the decoding processing control section 62 determines whether or not decoding processing is terminated before iterating decoding processing maximum times of iteration.

$$\hat{x}_n = \begin{Bmatrix} 0 & Z_n^i \geq 0 \\ 1 & Z_n^i < 0 \end{Bmatrix} \quad (7)$$

The hard decision data memory 74 is adapted to store the hard decision data from the hard decision section 72 in the area of the address outputted from the second buffer 68.

The decoder output interface section (decoder output IF) 75 is adapted to read out and output the hard decision data stored in the hard decision data memory 74 as decoding data when a decoding termination notification is given from the decoding processing control section 62.

In the case of the second embodiment, as plural code blocks can be decoded in parallel in a time-shared manner, the capacity of each of the Fn memory 61, Zn memory 67, Rmn memory 69, hard decision data memory 74, etc. is set to be large enough to store data of the plural code blocks at the same time.

The decoding processing control section 62, which functions to determine blocks and rows targeted for decoding processing, described above, has a detailed configuration shown in FIG. 7.

In FIG. 7, the decoding processing control section 62 includes decoding information storing sections 80-0 to 80-(B-1) for respective code blocks, decoding processing monitoring sections 81-0 to 81-(B-1) for respective code blocks, a scheduler 82, and an address generating section 83. It is noted that FIG. 7 shows the decoding information storing section 80-0 and the decoding processing monitoring section 81-0 only in the code block #0.

Each of the decoding information storing sections 80 (80-0 to 80-(B-1)) is a section that stores therein parity monitoring cycle, maximum number of times of decoding iteration, priority information, and parity check matrix information of a concerned code block supplied from outside via the decoder input interface section 60.

Each of the decoding processing monitoring sections 81 (81-0 to 81-(B-1)) is adapted to monitor the timing when decoding processing for a concerned code block is executed and decide termination of the decoding processing. Each of the decoding processing monitoring sections 81 (81-0 to 81-(B-1)) functionally includes a parity counter 90 (90-0 to 90-(B-1)), a decoding iteration counter 91 (91-0 to 91-(B-1)), a row counter 92 (92-0 to 92-(B-1)), a Wait cycle calculation section 93 (93-0 to 93-(B-1)), and a Wait counter 94 (94-0 to 94-(B-1)), as shown in FIG. 7 in terms of the decoding processing monitoring section 81-0. The functions of the decoding processing monitoring section 81 will be described in details in the chapter explaining the operation.

The scheduler 82 is adapted to generate a schedule of decoding processing per row based on information from the decoding processing monitoring sections 81-0 to 81-(B-1) of all the code blocks. It is adapted to give a number (block number), row number, and parity check matrix information of a code block that is intended to execute decoding processing at the present point to the address generating section 83 and also generate a selector control signal to be supplied to the selector 63 in FIG. 6. The number of the code block that is intended to execute decoding processing at the present point is fed back to the decoding processing monitoring sections 81-0 to 81-(B-1) of all the code blocks.

The address generating section 83 is adapted to generate memory addresses for the aforementioned Fn memory 61, Zn memory 67, and Rmn memory 69 in FIG. 6 based on the block number, row number, and parity check matrix information given from the scheduler 82.

(B-2) Operation of the Second Embodiment

Next, the operation of the LDPC codes decoder 51 according to the present embodiment constituted as shown in aforementioned FIGS. 6 and 7 (LDPC codes decoding method) will be explained.

Data (channel data) of each code block supplied from outside is written in the Fn memory 61 via the decoder input interface section 60, and decoding information inputted in parallel with the data (channel data) is written in the decoding information storing section 80 (80-0 to 80-(B-1); hereinafter, the branch numbers of the numerals will be omitted in the description) of the corresponding and concerned code block in the decoding processing control section 62.

Figure 8:
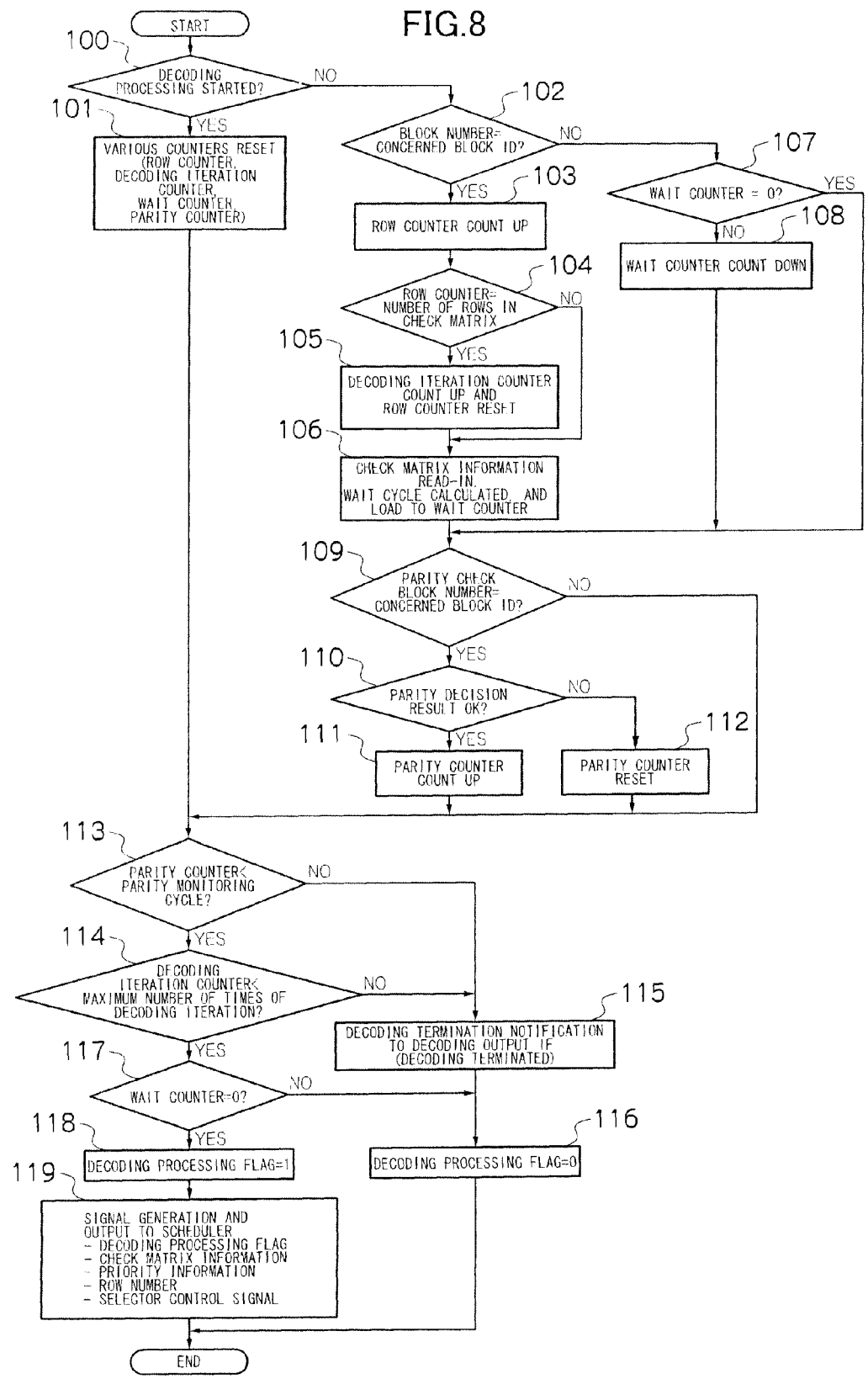
FIG. 8 is a flowchart showing processing of a decoding processing monitoring section according to the second embodiment.

Each decoding processing monitoring section 81 in the decoding processing control section 62 starts a sequence of processing shown in FIG. 8 after decoding information has been written in the corresponding decoding information storing section 80. For example, the processing shown in FIG. 8 is started every unit time (hereinafter referred to as cycle) when a processing target row is reviewed. Also, for example, all the decoding information storing sections whose decoding information is set and that require decoding processing at the present point execute the processing shown in FIG. 8 in sync with one another under control of the scheduler 82, although showing signal lines in the figure is omitted. It is noted that FIG. 8 is a flowchart showing processing of each decoding processing monitoring section 81. It is noted that the cycle corresponds to a cycle in which "i" in each equation is updated in the aforementioned TDMP algorithm.

When the decoding processing monitoring section 81 starts processing shown in FIG. 8, it determines whether or not decoding processing for the concerned code block is to be started from now on (Step 100).

In a case where the decoding processing is to be started from now on, the decoding processing monitoring section 81 resets all the counters built therein (the parity counter 90, the decoding iteration counter 91, the row counter 92, and the Wait counter 94) (Step 101).

On the other hand, in a case where decoding processing for the concerned code block is already started, the decoding processing monitoring section 81 determines whether or not the code block for which row processing has been executed in the previous cycle is the concerned code block based on the block number supplied from the scheduler 82 (Step 102).

In a case where the row of the concerned code block has been processed in the previous cycle, the decoding processing monitoring section 81 counts up the row counter 92 (Step 103) and then determines whether or not the count value of the row counter 92 has corresponded to the number of rows in the check matrix (Step 104).

Here, the count value of the row counter 92 represents a row of the concerned code block to undergo decoding processing next time. Since the count value "0" represents a first row, a case where the count value corresponds to the number of rows of the check matrix means that row processing for the last row has just finished. In a case where the count value of the row counter 92 corresponds to the number of rows of the check matrix, the decoding processing monitoring section 81 counts up the decoding iteration counter 91 and resets the row counter 92 (to "0", a value representing a first row) (Step 105). The decoding iteration counter 91 is adapted to count the number of times of decoding processing iteration.

In a case where the count value of the row counter 92 that has been counted up in Step 103 does not correspond to the number of rows of the check matrix, or after the decoding processing monitoring section 81 has counted up the decoding iteration counter 91 and reset the row counter 92, the decoding processing monitoring section 81 reads in the parity check matrix information stored in the decoding information storing section 80, lets the Wait cycle calculation section 93 calculate the Wait cycle, and loads the obtained Wait cycle value to the Wait counter 94 (Step 106).

It is noted that the Wait cycle calculation section 93 may be configured as hardware or may be provided as a subroutine.

When a row is to be processed, the row cannot be processed until the processing of a row and a column containing the same bit node as one contained in the target row is completed. The Wait cycle is a cycle number until a processing target row represented by the count value of the row counter 92 can start processing. The Wait cycle calculation section 93 calculates the Wait cycle in accordance with locations of bit nodes on the processing target row of the check matrix and locations of bit nodes on other rows on the columns where the bit nodes on the processing target row are located.

FIG. 9 shows an example of a check matrix (FIG. 9(A)) and the Wait cycle for each row of the check matrix (FIG. 9(B)). In FIG. 9, L is the number of cycles until row processing and column processing for one row are completed. For example, 6 cycles can be applied to L.

On the $1^{st}$ row (the row number is "0"), bit nodes exist on the $6^{th}$, $15^{th}$, and $23^{rd}$ columns, and on these columns, bit nodes exist on the $15^{th}$, $8^{th}$, and $13^{th}$ rows. In a case where the $15^{th}$ row is a processing target row, the processing for the row is completed L cycles after it becomes a processing target row. Thus, even when the $1^{st}$ row having a bit node on the same column becomes a processing target row after the $16^{th}$ to $18^{th}$ rows become processing target rows, the $1^{st}$ row cannot start processing immediately but must wait L−3 cycles before start ("3" is the number of cycles corresponding to the $16^{th}$ to $18^{th}$ rows).

A row that has a bit node on the same column as the $15^{th}$ column of the $1^{st}$ row is the $8^{th}$ row, and there is a sufficiently longer period than L cycles until the processing target row changes from the $8^{th}$ row to the $1^{st}$ row. Thus, there is no need to consider the Wait cycle in terms of this column, and the same is true on the $23^{rd}$ column of the $1^{st}$ row.

When the $2^{nd}$ row (the row number is "1") becomes a processing target row, the processing for the $16^{th}$, $9^{th}$ and $14^{th}$ rows having a bit node on the same column has been completed because the $1^{st}$ row waits the Wait cycle before starting the processing, and thus the Wait cycle is "0". The same is true on the $3^{rd}$ to $6^{th}$ rows.

On the $7^{th}$ row (the row number is "6"), bit nodes exist on the $10^{th}$ and $14^{th}$ columns, and on these columns, bit nodes exist on the $17^{th}$ and $6^{th}$ rows. In a case where the $6^{th}$ row is a processing target row, the processing for the row is completed L cycles after it becomes a processing target row. Thus, even when the $7^{th}$ row having a bit node on the same column becomes a processing target row, the $7^{th}$ row cannot start processing immediately but must wait L cycles before start.

As for the $8^{th}$ and subsequent rows, the Wait cycle is determined by calculation in the same manner. The resulting table of the Wait cycles for the respective rows is shown in FIG. 9(B).

The Wait cycle calculation section 93 may have any internal configuration and any processing method as far as it can calculate the Wait cycles shown in FIG. 9(B). For example, the section recognizes locations of all the bit nodes on a processing target row, then recognizes rows having a bit node on the same column as one of the columns of bit nodes on the processing target row, and recognizes a row that becomes a processing target row most recently among the recognized rows. Then, it determines if the difference (the number of rows) between the recognized row and the concerned row is a predetermined cycle L or less. If the difference is not the predetermined cycle L or less, the section sets "0". If the difference is the predetermined cycle L or less, the section searches a row whose Wait cycle has been set to some number other than "0" among rows from the concerned row to a row (back row) L rows before the concerned row if any and sets a Wait cycle for the concerned row by subtracting the Wait cycle for the back row from the predetermined cycle L.

In a case where the negative result is obtained as a result of determination of whether or not the code block for which row processing has been executed in the previous cycle is the concerned code block in aforementioned Step 102, the decoding processing monitoring section 81 determines whether or not the count value of the Wait counter 94 is 0 (Step 107). If it is not 0, the decoding processing monitoring section 81 counts down the Wait counter 94 (Step 108).

After the aforementioned operations of the row counter 92, the decoding iteration counter 91, and the Wait counter 94 are completed (Steps 102 to 108), the decoding processing monitoring section 81 determines whether or not the parity check block number coming from the parity decision section 73 in FIG. 6 represents the concerned code block (Step 109). Meanwhile, in a case where no parity check block number comes, the same processing as one in a case where the incoming parity check block number does not represent the concerned code block is executed.

In a case where the parity check block number represents the concerned code block, the decoding processing monitoring section 81 also determines whether or not the parity decision result coming together with the parity check block number is OK (the case where aforementioned HX=0 shall be OK) (Step 110). If it is OK, the decoding processing monitoring section 81 counts up the parity counter 90 (Step 111). If it is NG, the decoding processing monitoring section 81 resets the parity counter 90 (Step 112).

In a case where decoding processing has just started, and thus the various counters are reset (Step 101), in a case where the incoming parity check block number does not represent the concerned code block (a negative result in Step 109), or in a case where the operation of the parity counter 90 has been completed (Steps 111 and 112), the decoding processing monitoring section 81 determines whether or not the count value of the parity counter 90 is smaller than the parity monitoring cycle stored in the decoding information storing section 80 (Step 113). In a case where the count value of the parity counter 90 is smaller than the parity monitoring cycle, the decoding processing monitoring section 81 determines whether or not the count value of the decoding iteration counter 91 is smaller than the maximum number of times of decoding iteration stored in the decoding information storing section 80 (Step 114). These determination processing operations in Steps 113 and 114 are determination of whether or not the decoding processing is terminated.

When the count value of the parity counter 90 reaches the parity monitoring cycle, or when the count value of the decoding iteration counter 91 reaches the maximum number of times of decoding iteration, the decoding processing monitoring section 81 transmits a decoding termination notification specifying the concerned code block to the decoder output interface section 75 in FIG. 6 (Step 115) and sets the decoding processing flag to "0" ("1" indicates that the decoding processing is in progress) (Step 116) to terminate a sequence of processing shown in FIG. 8.

If the conditions for terminating the decoding processing are not met, the decoding processing monitoring section 81 determines whether or not the count value of the Wait counter 94 is 0 (Step 117). If the count value of the Wait counter 94 is other than 0 (that is, if the decoding processing monitoring section 81 is under the conditions in which it has to wait before decoding processing), the decoding processing monitoring section 81 sets the decoding processing flag to "0" (Step 116) to terminate a sequence of processing shown in FIG. 8.

On the other hand, if the count value of the Wait counter 94 is 0, the decoding processing monitoring section 81 sets the decoding processing flag to "1" (Step 118) and then generates signals to be supplied to the scheduler 82 (Step 119) to terminate a sequence of processing shown in FIG. 8.

The signals to be supplied to the scheduler 82 are priority information and parity check matrix information (or only the information on the processing target row may be sufficient) stored in the decoding information storing section 80, a count value of the row counter 92 (a processing row number), a decoding processing flag, and a selector control signal. The selector control signal is a control signal that lets the selector select the output of the Fn memory 61 at the time of the first decoding processing for the processing target row based on the count value of the decoding iteration counter 91.

Meanwhile, when setting the decoding processing flag to "0" (Step 116) as well, the decoding processing monitoring section 81 may supply a signal indicating the situation to the scheduler 82.

In the scheduler 82, with reference to the decoding processing flags and the priority information outputted from the respective decoding processing monitoring sections 81-0 to 81-(B-1), a code block with the highest priority among the code blocks whose decoding processing flag is "1" is selected. Then, the scheduler 82 gives the number (block number), the row number, and the parity check matrix information of the code block for which the decoding processing is to be executed at the present point (present cycle) to the address generating section 83 and gives the selector control signal supplied in terms of the code block to the aforementioned selector 63 in FIG. 6 as it is. The number of the code block for which the decoding processing is to be executed at the present point is given to the decoding processing monitoring sections 81-0 to 81-(B-1) of all the code blocks as well.

Meanwhile, the scheduler 82 may schedule a processing target code block and row number in a future cycle as well as in the present cycle.

In the address generating section 83, addresses to be supplied to the various memories 61, 67, and 69 are generated based on the information outputted from the scheduler 82 and are supplied to the corresponding memories 61, 67, and 69. From the respective memories 61, 67, and 69 are read out data required for input of the target row processing in the processing target code block.

By the selector 63 that responds to the selector control signal from the scheduler 82, output data from the subtracter section 71 performing calculation in aforementioned Equation (1) basically becomes input data Lmn to the row processing circuit 64. Data read out from the Fn memory 61 becomes input data Lmn to the row processing circuit 64 when an initial value is used as a log likelihood ratio Zn.

Also, from the Fn memory 61 is read out data required for calculation in Equation (6), and it is stored in the first buffer 65.

In the row processing circuit 64, calculation in aforementioned Equation (2) is performed, and the row processing result Rim is outputted from the row processing circuit 64 after M (<=L) cycles. The row processing result Rmn updated as such is stored in the Rmn memory 69. Also, in the adder section 66, the updated row processing result Rmn and the data Fn read out from the Fn memory 61 whose timing has been controlled via the first buffer 65 are added (that is, Equation (6) is performed), and the updated log likelihood ratio Zn is stored in the Zn memory 67.

The log likelihood ratio Zn and the row processing result Rmn stored in the Zn memory 67 and the Rmn memory 69 are outputted at a later timing than the time when they are written due to the function of the corresponding second buffer 68 and third buffer 70 and are used for calculation in Equation (1) by the subtracter section 71.

Also, the result of hard decision on the log likelihood ratio Zn by the hard decision section 72 is stored in the hard decision data memory 74, parity check is executed by the parity decision section 73 with use of the obtained hard decision data, and the parity decision result is outputted to the decoding processing control section 62. This parity decision result is utilized as explained in FIG. 8.

When the decoder output interface section 75 receives a decoding termination notification outputted from the decoding processing control section 62 as described above, it reads out and outputs a decoding result (decoding data) for the code block related to the decoding termination notification from the hard decision data memory 74.

Meanwhile, information on which code block's decoding data may be added to the decoding data, and also an output line per code block may be provided as an output line from the decoder output interface section 75 so that data is outputted to a corresponding output line, although these are not described clearly in FIG. 6. Such a modification example can be applied to the decoder input interface section 60 as well.

FIGS. 10(B) and 10(C) are timing charts each showing the processing target code blocks and rows determined by the decoding processing control section 62 for respective cycles. FIG. 10(B) shows a case where #0 is the only code block that undergoes decoding processing, and FIG. 10(C) shows a case where #0 and #2 are the code blocks that undergo decoding processing and where the code block #0 has higher priority than the code block #2. For reference, FIG. 10(A) shows a case where #0 is the only code block and where the Wait cycle is fixed (refer to Document 4).

Meanwhile, FIG. 10 shows a case where the check matrix of the code block #0 is one shown in FIG. 9(A) and where the cycle L required for decoding processing for 1 row is 6 cycles.

As shown in FIG. 10(A), in a case where the Wait cycle is fixed to the cycle L (=6) required for decoding processing, the Wait time as long as L (=6) cycles per 6 rows is always required, and the Wait time as long as 6×3=18 cycles is required per decoding processing.

On the other hand, in a case where the Wait cycle is derived by calculation (thus, the Wait cycle is variable) and where the code block can be processed after the Wait cycle has passed, the entire Wait time (Wait cycle number) in a case where the code block that undergoes decoding processing is only one as in FIG. 10(B) can be shorter than that in a case where the Wait cycle is fixed as in FIG. 10(A). For example, the Wait time before the processing for the $7^{th}$ row is executed is 6 cycles, and the Wait time before the processing for the $13^{th}$ or $1^{st}$ row is executed is 3 cycles. Thus, the Wait time in one decoding processing is 6+3×2=12 cycles, which is shorter than that in FIG. 10(A) by 6 cycles.

Further, in a case where plural code blocks are processed while they are scheduled, the Wait time in decoding processing for a code block can be allocated to decoding processing for another code block, and thus throughput of the processing section that executes decoding processing can be improved. For example, as shown in FIG. 10(C), decoding processing for the code block #2 can be executed during the Wait time when decoding processing for the code block #0 cannot be executed.

(B-3) Effect of the Second Embodiment

According to the second embodiment, the Wait time (Wait cycle) is determined to cause wait before processing in accordance with the configuration of the check matrix so that processing for a processing target row can be executed immediately when decoding processing is enabled. Thus, meaningless Wait time such as time to wait before processing although decoding processing is enabled can be prevented, and throughput of the decoding processing can be improved.

Also, according to the second embodiment, the scheduler controls decoding processing of plural code blocks so as to enable time-shared parallel processing. Thus, the Wait time in decoding processing for a code block can be allocated to decoding processing for another code block. In this respect as well, throughput of the decoding processing can be improved.

Further, according to the second embodiment, error detection is executed per decoding iteration, and if the error detection result is OK predetermined times consecutively, decoding processing maximum times of iteration may not be executed, but decoding processing may be terminated. Thus, time saved by reduction in the number of decoding processing operations can be utilized for processing for another code block etc. In this respect as well, throughput of the decoding processing can be improved.

(B-4) Modified Example of the Second Embodiment

In the second embodiment, although the configuration in FIG. 6 has been shown as a configuration to execute decoding processing, a configuration to execute decoding processing is not limited to one shown in FIG. 6 because the second embodiment is characterized by a method for determining a row that undergoes decoding processing (or combination of a block and a row). For example, some section (e.g., memory) may be configured to be multiple.

Also, in the second embodiment, decoding information is inputted from outside. However, plural kinds of decoding information may be set in the decoding processing control section in advance so that they can be selected later.

Further, in the second embodiment, the Wait cycle is calculated and derived each time as shown in FIG. 9(B). However, it may be inputted to the decoding processing control section from outside, in the same manner as decoding information.

In the second embodiment, the LDPC codes decoder that can process plural code blocks has been shown. However, the present invention can also be applied to an LDPC codes decoder that can process only one code block. In such a case, a scheduler in FIG. 7 has only to be omitted.

Also, in the second embodiment, the scheduler always determines a code block that undergoes decoding processing in accordance with priority information if code blocks are not in the Wait state. However, a method for selecting one from among plural code blocks is not limited to one in the second embodiment, but another method may be used such as a method in which priority of a selected code block is lowered by 1 level such that the code block can be used for determination of a code block in the next cycle.

Meanwhile, the row processing calculation in the second embodiment may be calculation of an approximate equation to Equation (2) in the same manner as that in the first embodiment.

This application claims priority from Japanese Patent Application 2006-222531, filed Aug. 17, 2006 and Japanese Patent Application 2006-224431 filed Aug. 21, 2006, which are incorporated herein by reference in their entirety.

What is claimed is:

1. A low density parity check codes decoder for executing decoding processing of plural code blocks in parallel, comprising:
    a decoding processing unit configured to execute decoding processing of the plural code blocks in parallel;
    a priority information unit configured to store priority information added to each of said code blocks; and
    a processing code block determining unit configured to determine a code block of the plurality code blocks that said decoding processing unit is to decode based on the priority information added to the plural code blocks that undergo decoding processing.

2. The low density parity check codes decoder according to claim 1, wherein an algorithm in which a decoding result is updated per row processing has been applied to said decoding processing unit, further comprising:
    a processing wait information storing unit provided for each code block and configured to store time information on a time period from time when a row before a target row starts decoding processing to time when the target row can start processing, determined depending on information on a check matrix for a low density parity check code to be decoded; and
    a start instruction postponing unit provided for each code block and configured to instruct said decoding processing unit to start decoding processing for the target row after waiting at least as long as the time information stored in said processing wait information storing unit,
    wherein said processing code block determining unit determines a code block that said decoding processing unit is to decode based on the priority information from among code blocks that have been instructed to start by said start instruction postponing unit.

3. The low density parity check codes decoder according to claim 1, further comprising:
a parity check consecutive time measuring unit configured to measure the number of consecutive times of OK as the parity check result after said decoding processing unit executes a parity check for a processed row per decoding iteration; and
a termination instructing unit configured to cause termination of decoding processing when said number of consecutive times reaches a predetermined value.

4. A low density parity check codes decoding method to which an algorithm in which a decoding result is updated per row processing has been applied as a decoding algorithm for a low density parity check code, comprising:
a decoding processing step for executing, by a processor, decoding processing of the plural code blocks in parallel,
a processing wait information storing step for storing, in a storage medium, time information on a time period from a time when a row before a target row starts decoding processing of the plural code blocks to a time when the target row can start processing, determined depending on information on a check matrix for a low density parity check code to be decoded, and
a start instruction postponing step for instructing said decoding processing step to start decoding processing for the target row after waiting at least as long as the time information stored in said processing wait information storing step.

5. The low density parity check codes decoding method according to claim 4, further comprising:
a parity check consecutive time measuring step for measuring the number of consecutive times of OK as the parity check result after said decoding processing step executes a parity check for a processed row per row processing, and
a termination instructing step for causing termination of decoding processing when said number of consecutive times reaches a predetermined value.

6. A low density parity check codes decoding method for executing decoding processing of plural code blocks in parallel, comprising:
a decoding processing step for executing, by a processor, decoding processing of the plural code blocks in parallel,
a priority information storing step for storing, in a storage medium, priority information added to each of said code blocks, and
a processing code block determining step for determining a code block of the plural code blocks that said decoding processing step is to decode based on the priority information added to the plural code blocks that undergo decoding processing.

7. The low density parity check codes decoding method according to claim 6, wherein an algorithm in which a decoding result is updated per row processing has been applied to said decoding processing step, further comprising a processing wait information storing step for each code block and a start instruction postponing step for each code block,
said each processing wait information storing step for storing time information on a time period from time when a row before a target row starts decoding processing to time when the target row can start processing, determined depending on information on a check matrix for a low density parity check code to be decoded, and
said each start instruction postponing step for instructing said decoding processing step to start decoding processing for the target row after waiting at least as long as the time information stored in said processing wait information storing step,
wherein said processing code block determining step determines a code block that said decoding processing step is to decode based on the priority information from among code blocks that have been instructed to start by said start instruction postponing step.

8. The low density parity check codes decoding method according to claim 6, further comprising:
a parity check consecutive time measuring step for measuring the number of consecutive times of OK as the parity check result after said decoding processing step executes a parity check for a processed row per decoding iteration, and
a termination instructing step for causing termination of decoding processing when said number of consecutive times reaches a predetermined value.

9. A low density parity check codes decoder to which an algorithm in which a decoding result is updated per row processing has been applied as a decoding algorithm for a low density parity check code, comprising:
a decoding processing unit configured to execute decoding processing of the plural code blocks in parallel;
a processing wait information storing unit configured to store time information on a time period from a time when a row before a target row starts decoding processing of the plural code blocks to a time when the target row can start processing, determined depending on information on a check matrix for a low density parity check code to be decoded; and
a start instruction postponing unit configured to instruct said decoding processing unit to start decoding processing for the target after waiting at least as long as the time information stored in said processing wait information storing unit.

10. The low density parity check codes decoding method according to claim 9, further comprising:
a parity check consecutive time measuring unit configured to measure the number of consecutive times of OK as the parity check result after said decoding processing unit executes a parity check for a processed row per row processing, and
a termination instructing unit configured to cause termination of decoding processing when said number of consecutive times reaches a predetermined value.

* * * * *